United States Patent
Breu et al.

(10) Patent No.: US 6,736,307 B2
(45) Date of Patent: May 18, 2004

(54) METHOD FOR MOUNTING LEADFRAMES

(75) Inventors: Johann Breu, Rattiszell (DE); Josef Dirnberger, Nittenau (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/371,139

(22) Filed: Feb. 21, 2003

(65) Prior Publication Data

US 2003/0121955 A1 Jul. 3, 2003

Related U.S. Application Data

(62) Division of application No. 09/741,305, filed on Dec. 18, 2000, now abandoned.

(30) Foreign Application Priority Data

Dec. 16, 1999 (EP) .............................. 99125131

(51) Int. Cl.⁷ .............................................. B23K 31/02
(52) U.S. Cl. ..................................................... 228/212
(58) Field of Search .................... 228/180.21, 212, 228/44.7, 43, 213, 47.1

(56) References Cited

U.S. PATENT DOCUMENTS

| | | |
|---|---|---|
| 4,635,788 A | 1/1987 | McDonald |
| 4,887,758 A | 12/1989 | Suzuki et al. |
| 4,973,244 A | 11/1990 | Deambrosio et al. |
| 5,292,388 A * | 3/1994 | Candore ........................ 156/64 |
| 5,501,316 A | 3/1996 | Hermening et al. |
| 5,661,090 A | 8/1997 | Otani |
| 5,685,410 A | 11/1997 | Ritola et al. |

OTHER PUBLICATIONS

Patent Abstracts of Japan No. 55–088339 (Takeshi), dated Jul. 4, 1980.

Patent Abstracts of Japan No. 09–266220. (Hiroyuki), dated Oct. 7, 1997.

Patent Abstracts of Japan No. 02–130849 (Nobuo), dated May 18, 1990.

* cited by examiner

Primary Examiner—Kiley Stoner
Assistant Examiner—Jonathan Johnson
(74) Attorney, Agent, or Firm—Laurence A. Greenberg; Werner H. Stemer; Gregory L. Mayback

(57) ABSTRACT

The present invention relates to a method for mounting electrical components on leadframes. A conveyor belt is used, having a holder which is attached to the conveyor belt. A leadframe is placed on the conveyor belt and is adjusted and held in position relative to the holder. The leadframe thus maintains its position relative to the endless conveyor belt throughout the entire period for which it remains on the endless conveyor belt.

16 Claims, 3 Drawing Sheets

METHOD FOR MOUNTING LEADFRAMES

CROSS-REFERENCE TO RELATED APPLICATION

This application is a divisional of U.S. application Ser. No. 09/741,305, filed Dec. 18, 2000, now abandoned.

BACKGROUND OF THE INVENTION

Field of the Invention

The present invention relates to a method for mounting electronic components on leadframes.

Electronic components, such as integrated circuits, are mounted on a base material (leadframe), are connected to the leadframe by electrical conductors, and are then provided with a package. Methods such as those described in U.S. Pat. No. 4,887,758 are used for this purpose.

Normally, the leadframes form a strip which is inserted into the process configuration. The strip is not cut up into the individual leadframes until the electronic component has been connected to the leadframe.

On the other hand, individual leadframes are also used, which are fed independently to the process configuration. This is done, for example, for power components such as power transistors. For this purpose, a leadframe is placed and positioned on a work plate, and a conveyor system moves the leadframe over the work plate from one processing station to the next processing station.

The conveyor system comprises, for example, a clamp or tongs which grip the leadframe. The conveyor system may also comprise conveyor pins which are plugged into holes located in the leadframe. A large number of these clamping apparatuses are provided along the process configuration.

Once the leadframes have been gripped, all the leadframes that are located on the work plate are moved through one step on the work plate. This movement process can be carried out either simultaneously or else asynchronously. The clamps are released again and the conveyor system moves back to the original position, at which a new leadframe has already been inserted into the process configuration.

All the leadframes are gripped once again, and are indexed forward, i.e., moved one step forward on the work plate.

One problem in this case is that an adjustment inaccuracy can occur when a leadframe that has already been moved forward is gripped. If this is the case, then the clamping apparatus cannot grip the leadframe exactly at the intended point, leading to maladjustments and incorrect production processes.

Normally, when a leadframe is on the work plate, it passes through a process step in which solder is applied to accurately predetermined positions on the leadframe. An electrical component is then positioned on the leadframe and is soldered in an oven at a temperature of 200° to 500° C. Exact positioning of the electrical component is also necessary during this process, in order to avoid incorrect production processes.

The high temperature of between 200® and 500° C. has a disadvantageous effect on the mechanical adjustment accuracy of the clamps with respect to the leadframes. The thermal expansion to which the conveyor system and the leadframe are subject causes maladjustments. When hot, any error can be corrected only with great difficulty.

SUMMARY OF THE INVENTION

The object of the present invention is to provide a method for connecting electronic components to a leadframe which overcomes the above-noted deficiencies and disadvantages of the prior art devices and methods of this general kind, and in which incorrect processing actions are avoided.

With the above and other objects in view there is provided, in accordance with the invention, a process configuration for assembly of electronic components on leadframes, comprising:

an endless conveyor belt;

a holder mounted on the endless conveyor belt; and a leadframe arranged on the endless conveyor belt and adjusted relative to the holder.

With the above and other objects in view there is also provided, in accordance with the invention, a method which uses a process configuration having an endless conveyor belt and a holder which is attached to the endless conveyor belt. The method furthermore provides a leadframe which is placed on the conveyor belt and is adjusted relative to the holder.

In accordance with an added feature of the invention, at least a part of the conveyor belt is located in a temperature chamber. This arrangement makes it possible to subject the leadframe to a temperature step in which an electronic component can be connected, or soldered, to the leadframe.

In accordance with an additional feature of the invention, the leadframe has a hole or an index hole, on which the holder is adjusted and/or attached. The leadframe can be gripped securely through the hole. Furthermore, the hole can be used as an adjustment mark in which, for example, a pin is plugged through the hole in order in this way to prevent the leadframe from sliding out of position.

In accordance with another feature of the invention, a process step for connecting the leadframe to a component is arranged on the conveyor belt. This arrangement makes it possible to convey the leadframe on the conveyor belt and to connect an electrical component to the leadframe while the leadframe is located in an adjusted manner on the conveyor belt, and is locked there.

In accordance with a further advantageous refinement of the configuration according to the invention, a process step for making electrical contact between the leadframe and a component is arranged on the conveyor belt. This makes it possible to leave the leadframe in an adjusted manner on the conveyor belt while the leadframe is being conveyed further from a previous processing station to the processing station for making electrical contact. The electrical contact-making process (bonding) likewise requires exact adjustment in precisely the same way as the mechanical connection process (soldering), and this is provided by adjusting the leadframe with respect to the conveyor belt and with respect to the holder.

It is furthermore advantageous for the holder to be provided as a pin onto which the leadframe is plugged. This prevents the leadframe from sliding out of position.

The method according to the invention is carried out using a process configuration having an endless conveyor belt and a holder which is attached to the endless conveyor belt. When the method is being carried out, a leadframe is placed on the conveyor belt, and the leadframe is adjusted relative to the holder. The holder then locks the leadframe on the conveyor belt. This has the advantage that the leadframe assumes an accurately predetermined position on the conveyor belt and remains in this position relative to the conveyor belt throughout part of the process, or throughout the entire process.

In accordance with again an added feature of the invention, the conveyor belt, together with the leadframe placed on it, passes through a temperature chamber. This method step makes it possible to subject the leadframe to a process step in which a raised temperature is used. This is the case, for example, when soldering an electrical component on the leadframe.

In accordance with again an additional feature of the invention, a connector (connection means) is mounted on the leadframe. This may be, for example, solder material with which an electrical component is soldered to the leadframe in a temperature chamber.

In accordance with again another feature of the invention, a component is connected to the leadframe with the aid of the connector.

In accordance with again a further advantageous feature of the invention, a method step provides for the conveyor belt to be moved through a freely variable distance. This makes it possible to position the leadframe, which is attached to the conveyor belt by the holder, in a freely variable manner such that, for example, the connection means, the electrical component and/or an electrical contact can be fitted at a predetermined position on the leadframe.

In accordance with yet an added feature of the invention, the leadframe is electrically connected to an electrical component. This method step is used, for example, to fit bonding wires between the electrical component and the leadframe. A further advantageous refinement of the method according to the invention provides for a hole to be arranged in the leadframe, on which the holder is adjusted and/or attached. This procedure makes it possible to align the leadframe with respect to the hole and to grip it with the holder, so that the leadframe cannot slide out of position on the conveyor belt.

The arrangement according to the invention and the method according to the invention make it possible to place the leadframes on the conveyor belt in the cold state, that is to say outside a temperature chamber. Once the leadframes have left the temperature chamber, they can be removed from the endless conveyor belt once again, once they have cooled down. This has the advantage that each leadframe need be positioned and adjusted only once, and this is not done when they are hot within the temperature chamber, but outside when they are placed on the conveyor belt. A particularly advantageous feature in this case is that the thermal expansion within the temperature chamber does not cause any adjustment problems.

A further advantage of the arrangement according to the invention and of the method according to the invention is that forming gas purging in the temperature chamber can be carried out considerably more easily, in a more constant manner and more controllably.

Flexible adaptation between different leadframes and the endless conveyor belt is possible by means of an image recognition system, which produces optical centering. Furthermore, this allows free positioning and readjustment of the leadframe in every operating state and every processing step.

Other features which are considered as characteristic for the invention are set forth in the appended claims.

Although the invention is illustrated and described herein as embodied in a method for mounting leadframes, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

Identical and functionally equivalent elements are identified with identical reference symbols throughout the figures.

DESCRIPTION OF THE PREFERRED EMBODIMENTS

Figure 1:
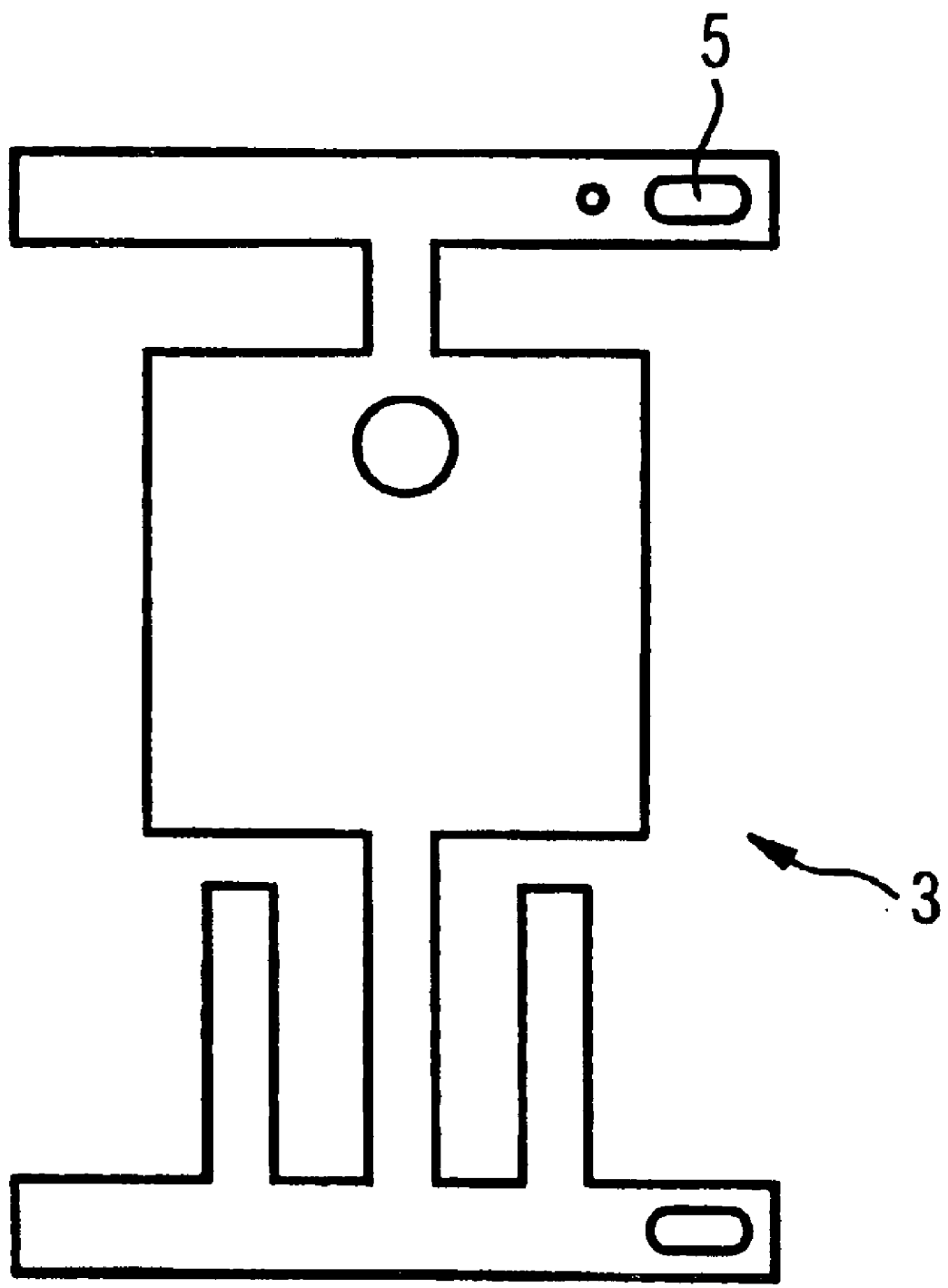
FIG. 1 is a plan view of a separated leadframe.

Referring now to the figures of the drawing in detail and first, particularly, to FIG. 1 thereof, there is seen an exemplary leadframe 3. The leadframe 3 is formed with a hole 5. Normally, the individual leadframes shown in FIG. 1 are in a strip, with further identical leadframes adjacent in a corresponding manner to the left and to the right of the leadframe 3.

Figure 2:
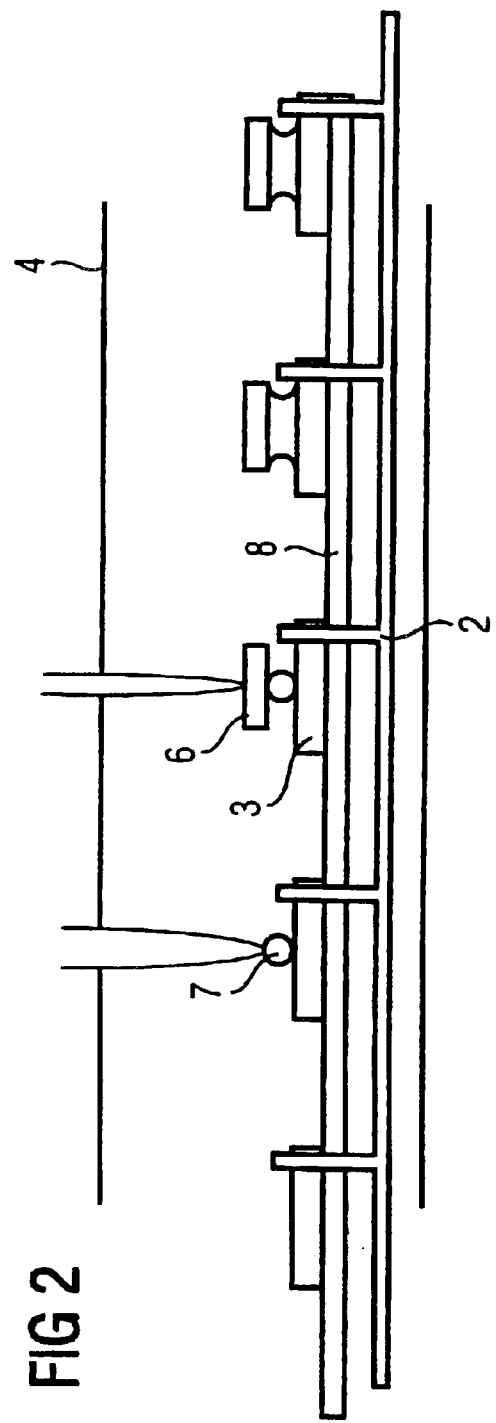
FIG. 2 is a diagrammatic side view of a conveyor system through a mounting process system according to the prior art.

With reference to FIG. 2, there is illustrated a process system for mounting individual leadframes according to the prior art. The leadframe 3 is arranged on a work plate 8 and is held by a holder 2. Furthermore, the leadframe 3 is moved on the work plate 8 by the holder 2. A connection means 7 is mounted on the leadframe 3 by means of a suitable apparatus. Within a temperature chamber 4, the electrical component 6 is connected to the leadframe 3 with the aid of the connection means 7.

Figure 3:
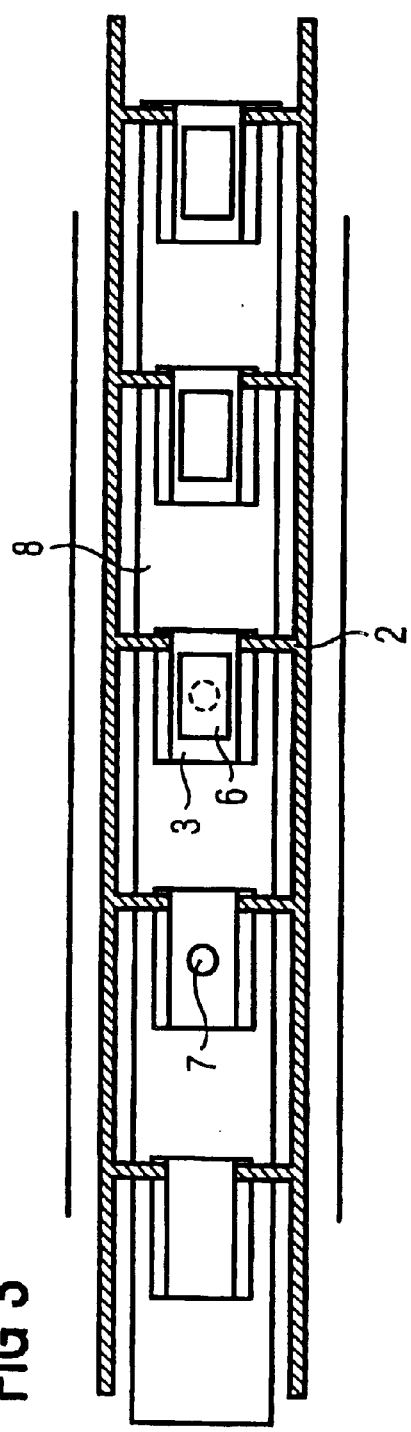
FIG. 3 is a plan view onto the conveyor system of in FIG. 2.

FIG. 3 shows a plan view of the mounting process system shown in FIG. 2. The leadframe 3 is located on the work plate 8 and is held by the holder 2. A connection means 7 is located on the leadframe 3 and is used to connect the electrical component 6 to the leadframe 3 in the temperature chamber.

Figure 4:
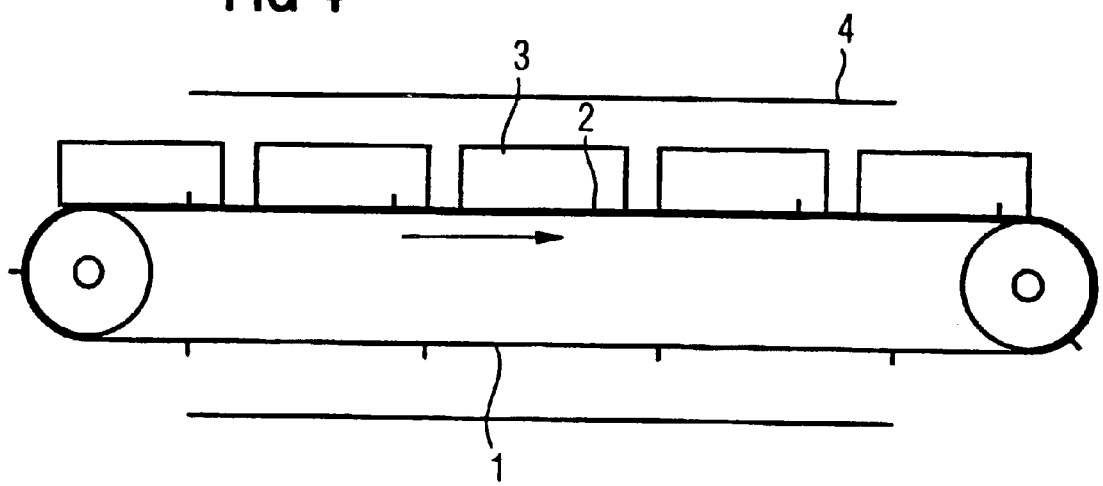
FIG. 4 is a side view of a conveyor system in a mounting process system according to the invention.

FIG. 4 shows an exemplary embodiment of a mounting process system according to the invention for processing individual leadframes. The novel system comprises an endless conveyor belt 1 on which a holder 2 is disposed. The leadframe 3 is adjusted on and/or is attached to the holder 2. The leadframe 3 is conveyed through the temperature chamber 4 with the aid of the conveyor belt 1.

Figure 5:
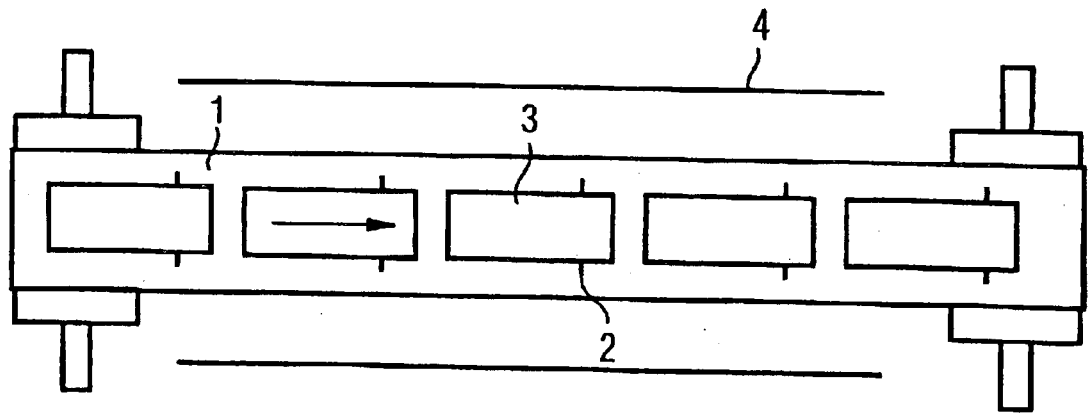
FIG. 5 is a plan view onto the mounting process system shown in FIG. 4.

FIG. 5 shows a plan view of the exemplary embodiment shown in FIG. 4. In this case, the leadframe 3 is located on the conveyor belt 1, with the leadframe 3 being adjusted on the holder 2. Furthermore, the holder 2 is used to connect the leadframe 3 to the conveyor belt 1.

We claim:

1. A method for mounting electronic components, which comprises the following steps:

provising a conveyor belt with a holder attached to the conveyor belt;

placing a leadframe on the holder;

adjusting the leadframe relative to the conveyor belt;

holding the leadframe in a fixed position relative to the conveyor belt with the holder;

mounting the electronic component on the leadframe; and removing the leadframe from the holder.

2. The method according to claim 1, which further comprises the step of mounting the electronic component on the leadframe by passing the leadframe through a temperature chamber for soldering the electronic component to the leadframe.

3. The method according to claim 2, which further comprises mounting a connector on the leadframe.

4. The method according to claim 1, which further comprises mounting the electronic component on the leadframe by:

mounting a connector on the leadframe;

passing the leadframe through a temperature chamber; and connecting the electronic component to the leadframe with the connector while passing the leadframe through the temperature chamber.

5. The method according to claim 1, which further comprises mounting the electronic component on the leadframe by electronically connecting the leadframe with the electronic component.

6. The method according to claim 1, wherein the leadframe has a hole formed therein and which further comprises adjusting the leadframe relative to the conveyor belt utilizing the hole of the leadframe as an adjustment mark.

7. The method according to claim 1, wherein the leadframe has a hole formed therein and which further comprises holding the leadframe in the fixed position relative to the conveyor belt utilizing the hole of the leadframe to securely grip the leadframe.

8. The method according to claim 1, which further comprises placing a leadframe on the conveyor belt utilizing an individual leadframe.

9. A method for mounting electronic components, which comprises the following steps:

providing a conveyor belt with a holder attached to the conveyor belt;

placing a leadframe on the holder;

adjusting the leadframe relative to the conveyor belt;

holding the leadframe in a fixed and predetermined position relative to the conveyor belt with the holder;

mounting the electronic component on the leadframe while the leadframe is held in the fixed and predetermined position relative to the conveyor belt; and subsequently removing the leadframe from the holder.

10. The method according to claim 9, which further comprises the step of mounting the electronic component on the leadframe by passing the leadframe through a temperature chamber for soldering the electronic component to the leadframe.

11. The method according to claim 10, which further comprises mounting a connector on the leadframe.

12. The method according to claim 9, which further comprises mounting the electronic component on the leadframe by:

mounting a connector on the leadframe;

passing the leadframe through a temperature chamber; and connecting the electronic component to the leadframe with the connector while passing the leadframe through the temperature chamber.

13. The method according to claim 9, which further comprises mounting the electronic component on the leadframe by electronically connecting the leadframe with the electronic component.

14. The method according to claim 9, wherein the leadframe has a hole formed therein and which further comprises adjusting the leadframe relative to the conveyor belt utilizing the hole of the leadframe as an adjustment mark.

15. The method according to claim 9, wherein the leadframe has a hole formed therein and which further comprises holding the leadframe in the fixed position relative to the conveyor belt utilizing the hole of the leadframe to securely grip the leadframe.

16. The method according to claim 9, which further comprises placing a leadframe on the conveyor belt utilizing an individual leadframe.

* * * * *